United States Patent [19]

Ramsland

[11] 4,052,678
[45] Oct. 4, 1977

[54] NOISE FLOOR INDICATIVE CIRCUIT

[75] Inventor: David Gordon Ramsland, Schaumburg, Ill.

[73] Assignee: Motorola, Inc., Schaumburg, Ill.

[21] Appl. No.: 604,563

[22] Filed: Aug. 14, 1975

[51] Int. Cl.² .............................................. H03G 3/32
[52] U.S. Cl. .................................. 330/281; 325/363; 325/410; 330/141; 330/145; 330/282
[58] Field of Search .................... 330/2, 29, 138, 141, 330/145; 325/363, 410; 179/1 P

[56] References Cited

U.S. PATENT DOCUMENTS

| | | | |
|---|---|---|---|
| 3,302,116 | 1/1967 | Free | 325/363 |
| 3,402,360 | 9/1968 | Millon | 330/141 X |
| 3,683,282 | 8/1972 | D'Amato et al. | 325/363 |
| 3,729,682 | 4/1973 | Elder | 325/304 |
| 3,774,113 | 11/1973 | Chasek | 325/363 |
| 3,831,093 | 8/1974 | Walker | 325/410 X |

*Primary Examiner*—James B. Mullins
*Attorney, Agent, or Firm*—James W. Gillman; Victor Myer; Phillip H. Melamed

[57] ABSTRACT

An improved circuit for producing a signal indicative of an input signal floor level is disclosed for use in determining the noise level of an audio signal in a receiver voting system. An input audio signal which contains noise is amplified by variable gain amplifier circuitry consisting of a constant gain amplifier and a variable attenuator. Detector circuitry then develops a signal which is indicative of the noise level, this signal substantially corresponding to the minimum peak magnitude of the amplified input audio signal. During pauses between audio tones in the input audio signal, this minimum signal magnitude coincides the residual background noise level of the input audio signal. Control circuitry couples the noise level indicative signal to the variable attenuator and constitutes a negative feedback loop for inversely and nonlinearly varying the amplification of the input signal in response to the magnitude of the noise indicative signal. In essence, the signal floor level circuit functions as an AGC circuit where the AGC control voltage is minimum level dependent and also corresponds to the noise floor indicative signal. The use of a negative feedback loop readily provides an accurate, nonlinearly varying, temperature stable noise level indicative signal for input audio signals having noise levels which vary over a large dynamic range.

8 Claims, 2 Drawing Figures

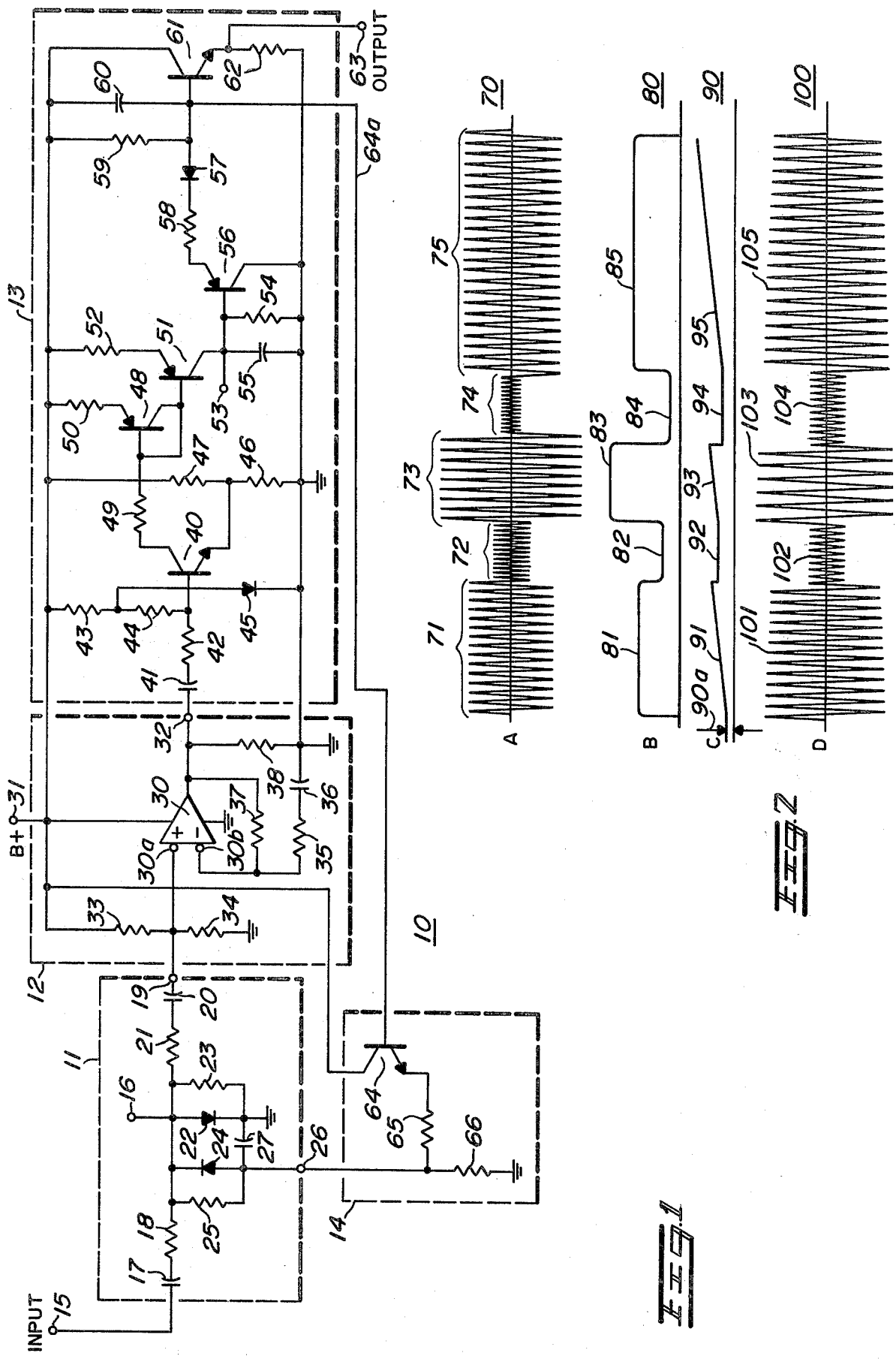

NOISE FLOOR INDICATIVE CIRCUIT

CROSS REFERENCE TO RELATED APPLICATIONS

The present invention is related to the invention described in the copending U. S. application entitled "An Improved Receiver Voting System", Ser. No: 604,562 Filed Aug. 14, 1975 now U. S. Pat. No. 40,013,962.

BACKGROUND OF THE INVENTION

The invention relates generally to the field of floor (minimum) level indicating circuits and more particularly to such circuits used for determining the noise level of an input signal in a receiver voting system. The term "floor level", as used herein, refers to the minimum magnitude of a signal and the term "noise level" refers to the background (residual) noise present on a signal.

Voting systems generally include several receivers which all receive the same transmitted signal and a selecting circuit which selects the received and detected signal having the lowest noise level. By maintaining the peak amplitudes of each of the detected signals at substantially equal levels, the selected signal will also correspond to the detected signal having the optimum signal to noise ratio. This optimum signal is then monitored until the selecting circuit determines that another receiver is receiving a signal having an even lower noise level. Thus the voting system continually selects the best (lowest noise level) received signal. Such systems are known in the prior art and one such system is described in a copending U. S. patent application entitled "An Improved Receiver Voting System", Ser. No. 604,562, filed Aug. 14, 1975, now Pat. No. 40,013,962 which is assigned to the same assignee as the present invention.

For each received signal a noise level indicative signal is generated. These indicative signals are then compared by the selecting circuit. Typically the noise levels of the signals received by different receivers will vary over an extremely large range, such as from 0 db to 40 db. If the noise indicative signals compared by the selecting circuit were linearly related to the noise level of the signal at the receiver, the selecting circuit would loose the ability to efficiently differentiate between two signals both having either very high noise levels or two signals having very low noise levels. This is because of the finite sensitivity of the selecting circuit and the requirement that the selecting circuit must be able to make decisions when the input noise levels vary over a large dynamic range. By way of example, the selecting circuit must be able to choose the best of two signals having noise levels of 0.5 $\mu V$ (microvolts) and 1.0 $\mu V$. In a linearly related noise floor versus indicating signal voting system which must operate over the above-mentioned typical ranges, voting decisions would then be made even when noise levels of 5.0000 mV( millivolts) and 5.0005 mV were compared. Obviously such decisions are not needed or desired and therefore a linear system is not efficient. In addition, indicating signals would occasionally have very large magnitudes in a linear system and selecting circuits capable of handling these large signals would then be required.

A prior solution to this problem is to use a log amplifier followed by an envelope detector and a valley detector. The input audio signal is logarithmically amplified by the log amplifier, a waveform representing the envelope of this amplified signal is produced, and the minimum "valley" value of this envelope signal is determined. During an audio tone pause, the valley level of this envelope signal will be representative of the noise level of the incoming receiver signal.

A substantial disadvantage of this prior system is that the gain of the log amplifier is usually temperature unstable and this can lead to the control circuit selecting the wrong receiver signal to be monitored. Also logarithmatic amplifiers are complex circuits in which the logarithmic response is generally approximated by a piecewise nonlinear technique. Thus matching the gain characteristics of several logarithmic amplifiers becomes very difficult. In voting systems such gain matching must be extremely accurate or else the signal having the lowest noise level will not be selected.

SUMMARY OF THE INVENTION

An object of the present invention is to provide an improved and simplified signal floor indicative circuit which overcomes all of the aforementioned deficiencies.

A more particular object of the invention is to provide an improved noise floor indicative circuit which produces a stable noise level indicative signal by using this signal in a negative feedback nonlinear control loop.

In one embodiment of the present invention a circuit is provided for producing an accurate floor indicative signal for input signals having floor levels varying over a large dynamic range, said floor level indicative circuit comprising: amplifier means having a controllable predetermined gain for receiving an input signal having a first floor level and producing an output signal having a second floor level related to said first floor level by the gain of said amplifier means; detector means coupled to said amplifier means for receiving said output signal and producing a floor level indicating signal related to said second floor level; and control means for inversely and nonlinearly varying the gain of said amplifier means in response to the magnitude of said floor level indicative signal, said control means comprising control circuitry in a feedback loop coupled between said detector means and said amplifier means.

Basically, an AGC (automatic gain control) loop is created between the output of a floor level detection circuit and a variable gain amplifier. An input signal, having a varying amplitude that occasionally reaches a floor level, is uniformly and linearly amplified by an amplifier circuit having a controllable gain. A detection circuit locates the floor level of the amplified input signal and produces a floor level indicative signal which substantially monitors the floor level of the amplified input signal. The floor level indicative signal is then negatively fed back to the amplifier circuit to inversely and nonlinearly vary the gain of the amplifier circuit in response to the magnitude of the floor level indicative signal. The result of this negative feedback loop is that the floor level of the amplified input signal is maintained at a substantially constant value while the control voltage fed back to the amplifier circuit provides a stable, accurate, and nonlinear signal indicative of the floor level of the input signal. The nonlinear variation of the gain of the amplifier circuit in response to the floor indicative signal is substantially created, in one embodiment of the present invention, by the indicative signal being used to nonlinearly vary the resistance of a diode in an attenuator network.

BRIEF DESCRIPTION OF THE DRAWINGS

For a more complete understanding of the invention reference should be made to the drawings, in which:

FIG. 1 is a schematic diagram of the inventive floor level indicating circuit; and FIGS. 2A, 2B, 2C and 2D are graphs illustrating typcial signal waveforms of the circuit shown in FIG. 1.

DESCRIPTION OF THE PREFERRED EMBODIMENT

FIG. 1 illustrates a noise floor level indicative circuit 10 basically comprising a variable attenuator 11, a constant gain amplifier 12, a detector circuit 13, and a control circuit 14 connected in a single circuit loop (elements 11-14 shown dashed).

The variable attenuator 11 receives an audio input signal from an input terminal 15 which is connected to an internal terminal 16 through a coupling capacitor 17 connected in series with a resistor 18. The attenuator 11 produces an attenuated audio output signal at a terminal 19 which is connected to the terminal 16 through a coupling capacitor 20 and a series resistor 21. A diode 22 and a resistor 23 are connected in parallel between the terminal 16 and ground, with the anode of diode 22 connected to the terminal 16. A diode 24 is connected in parallel with a resistor 25 between the terminal 16 and a control terminal 26, with the cathode of diode 24 connected to the terminal 16. An AC bypass capacitor 27 is connected between the terminal 26 and ground for effectively connecting the anode of diode 24 to AC ground. The components 16 through 27 are all included in the attenuator 11.

The constant gain amplifier 12 receives an attenuated audio signal from the variable attenuator 11 at terminal 19. The gain of amplifier 12 is provided by an operational amplifier 30 which has a high input terminal 30a directly connected to terminal 19. The amplifier 30 is coupled to ground and to a B+ terminal 31, and produces an output signal at a terminal 32 which is related to the signal present at terminal 19 by the gain of the amplifier 30. Biasing resistors 33 and 34 are connected between the terminal 30a and the B+ terminal 31 and ground, respectively. A low input terminal 30b of the amplifier 30 is connected to ground through a series resistor 35 and a capacitor 36, and connected to the terminal 32 through a resistor 37. A resistor 38 is connected between the terminal 32 and ground. The components 35 through 37 determine the gain and frequency response of the operational amplifier 30 in a manner which is well known in the prior art. Thus amplifier 12, which includes the components 30 through 38, provides an output signal at terminal 32 which represents the input signal at terminal 19 multiplied by a constant (independent of input signal level) gain.

The components which comprise the detector circuit 13 will now be discussed. An NPN transistor 40 forms the first stage of the detector circuit and has its base connected to terminal 32 through an AC coupling capacitor 41 connected in series with a resistor 42. Bias is supplied to the transistor 40 by two series connected resistors 43 and 44 connected between the base of the transistor 40 and the B+ terminal 31. The junction between resistors 43 and 44 is connected to ground through a temperature compensating diode 45 which has its cathode connected to ground. The emitter of transistor 40 is connected to ground through a resistor 46 and to B+ through a resistor 47, and the collector of transistor 40 is connected to the base of a PNP transistor 48 through a resistor 49. The transistor 48 has its emitter connected to the terminal 31 through a resistor 50, and its collector directly connected to its base and to the base of a PNP transistor 51. The transistor 51 has its emitter connected to terminal 31 through a resistor 52, and its collector connected directly to a terminal 53 and connected to ground through the parallel combination of a resistor 54 and a capacitor 55. The terminal 53 is connected to the base of a PNP transistor 56 which has its collector connected directly to ground. The emitter of transistor 56 is connected to the cathode of a diode 57 through a resistor 58. The anode of diode 57 is connected to B+ through the parallel combination of a resistor 59 and a capacitor 60. This anode is also directly connected to the base of an NPN transistor 61 which has its collector connected to the B+ terminal 31 and its emitter connected to ground through a resistor 62. An output terminal 63 is directly connected to the emitter of transistor 61. The components 40 through 62 are all included in the detector circuit 13.

Basically the detector circuit 13 functions first as a peak signal detector which produces a first signal at terminal 53 that represents the peak magnitudes of the audio signal present at terminal 32. The detector then produces a second signal at the base of transistor 61 and at terminal 63 which substantially corresponds to the minimum magnitude of the peak detection signal present at terminal 53. The operation of detector circuit 13 will be described more fully subsequently.

The control circuit 14 generally comprises an NPN transistor 64 having its base connected to the base of transistor 61 by a conductor 64a, its collector connected to terminal 31, and its emitter connected to the control terminal 26 through a resistor 65. The terminal 26 is also connected to ground through a resistor 66. The components 64 through 66 form the control circuit 14.

The basis function of the control circuit 14 is to inversely and nonlinearly vary the attenuation of the variable attenuator 11 in response to the signal present at the base of transistor 61. Since this signal represents the noise floor of the input audio signal present at terminal 15, as will subsequently be explained, the control circuit 14 essentially forms a negative feedback loop to control the composite gain of elements 11 and 12 (which form a controllable amplifier means) such that the signal noise floor level at terminal 32 is maintained at an essentially constant level. Thus the control circuit 14 functions similarly to a negative feedback AGC loop which is used to maintain a signal at a relatively constant level.

The operation of the noise floor indicative circuit 10 shown in FIG. 1 will now be illustrated with reference to the signal waveforms shown in FIGS. 2A-D. The circuit will first be analyzed without considering the effects of the negative feedback loop created by the control circuit 14. Subsequently the effect of this negative feedback loop will be considered.

In FIG. 2A a graphical example of a typical audio input signal 70 which may be present at terminal 15 is illustrated. The vertical and horizontal scales of FIG. 2A correspond to amplitude and time, respectively. The audio signal 70 includes some residual noise and consists of a first tone 71, shown as having a constant predetermined magnitude, followed by an audio tone pause 72 during which no audio tone is present. The amplitude of the audio signal 70 during the pause 72 represents the background noise, or floor level, of the audio signal. The pause 72 is followed by a second audio tone 73 illustrated as having a larger magnitude than audio tone 71, a second audio pause 74 and a third audio tone 75 having substantially the same magnitude as the tone 71 and existing for a relatively long duration of time. The tones 71, 73 and 75 are illustrated as having constant magnitudes only for clarity. Obviously any actual audio signal 70, which would correspond to human speech, would have tone amplitudes which do not remain constant. The background noise or floor level, during the pause 74 is illustrated as being less than the noise floor level which occurs during pause 72 for the purpose of illustrating the operation of the floor indicative circuit 10.

The entire audio signal 70, including noise, will be uniformly attenuated by the variable attenuator 11. The amount of this uniform attenuation is determined by the signal present at the control terminal 26. For the present, a constant DC signal at terminal 26 will be assumed. This results in a fixed (constant) attenuation existing between terminals 15 and 19. Therefore the signal at terminal 19 is identical to the signal 70 with the exception that it has been uniformly attenuated by a fixed amount of attenuation.

The audio signal at terminal 19 is then amplified by the constant gain amplifier apparatus 12 and an output signal is produced at terminal 32 which is related to the input signal at terminal 19 by the gain of amplifier 12. The amplifier 12 includes the operational amplifier 30 which has its gain maintained at a constant level by the resistors 35 and 37 and its frequency response determined by the capacitor 36. The electrical characteristics of operational amplifiers having similarly connected gain controlling resistors and frequency response controlling capacitors are well known in the prior art and therefore will not be discussed. The basic function of amplifier 12 is to produce an output signal at terminal 32 having a noise floor level which is equal to the input signal noise floor level (at terminal 19) multiplied by a fixed gain factor. The output signal peaks (at terminal 32) may be limited if a large input signal is present at terminal 19, however this will not affect the operation of the subsequent circuit stages.

The detector circuit 13 takes the output signal present at terminal 32 and produces a signal related to the background noise floor level of the output signal, as will now be explained. The emitter of transistor 40 is held at a very low voltage level by the resistors 46 and 47. The gain of transistor 40 is temperature compensated by the diode 45. The audio and noise signal present at terminal 32 is coupled to the base of transistor 40 by the coupling capacitor 41 and the resistor 42. Whenever the audio signal present at the base of transistor 40 has a positive magnitude which is approximately 0.7 volts above the emitter voltage level, the transistor 40 will be turned on and draw a significant collector current through the resistor 49. This collector current will effectively cause the devices 48 and 51 to act as a constant current source for charging up the capacitor 55 from the collector current of transistor 51.

The charging rate of the capacitor 55 is determined by the output impedance of transistor 51 and the capacitance value of capacitor 55, whereas the discharge rate of the capacitor 55 is determined by the resistance value of resistor 54 and the capacitance of capacitor 55. The charge/discharge rate is usually expressed in terms of an "RC time constant" which is related to the capacitance value of the capacitor and the series resistance in the charge/discharge path. The transistors 40, 48, and 51, together with resistor 54 and capacitor 55, form part of a positive peak level detection circuit which produces a signal substantially corresponding to only the positive peak magnitudes of the output signal present at terminal 32. The term "peak level detection circuit", as used herein, refers to either a positive or negative peak level detection circuit. Such circuits are known in the prior art.

In FIG. 2B a graph is shown which represents a voltage signal 80 present at terminal 53 when the input signal 70 is present at terminal 15 and when a constant control signal is maintained at terminal 26. The FIG. 2B, as well as FIGS. 2C and 2D, has the same horizontal time scale as FIG. 2A. The voltage 80 represents a signal which corresponds to the positive peak magnitudes of the signal present at terminal 32. This peak magnitude signal is created by circuitry which responds to maximum positive magnitudes of an input signal.

The voltage which is generated at the base of transistor 61 in response to the voltage signal 80 being present at terminal 53 is illustrated graphically in FIG. 2C as a voltage signal 90. Before tone 71 occurs, the voltage 90 is maintained at a level 90a which is approximately the forward voltage drop of the diode 57 plus the base emitter drop of transistor 56. This is because the resistor 59 is selected to be much greater than the resistor 58, and the transistor 56 is in saturation since a low voltage is present at terminal 53. During the tone 71 the voltage at terminal 53 (waveform 80) increases to peak level 81 corresponding to the peak magnitude of tone 71. This results in the back biasing of diode 57 and the base emitter junction of transistor 56. This in turn results in the voltage at the base of transistor 61 increasing because of the discharging of the capacitor 60 through the resistor 59.

The resistor 59 is selected to be a high value resistor so that the voltage at the base of transistor 61 (signal 90) will respond very slowly to a maximum magnitude of the signal present at terminal 53. If the tone 71 were sufficiently long, the signal 90 would eventually level off to a voltage value equal to the voltage at terminal 53 plus the forward diode drop of diode 57, the base emitter drop of transistor 56, and the voltage across resistor 58.

When the audio pause 72 occurs, the voltage at terminal 53 will drop to a level 82 representing the background noise floor of the audio signal. This lower voltage at terminal 53 will cause a voltage drop on the emitter of transistor 56 causing the diode 57 to be forward biased. The forward biasing of diode 57 will now provide a charge path for the capacitor 60 through the diode 57, the resistor 58, and the transistor 56. The effective resistance in this charge path is selected to be much smaller than the resistance of resistor 59. Thus the voltage signal 90 will drop very rapidly to a level 92 in response to the minimum magnitude 82 of the voltage present at terminal 53. The voltage 90 will be maintained at substantially (ignoring the voltage across resistor 58) two diode drops above the voltage at terminal 53 during the audio pause 72.

When the audio tone 73 occurs, the voltage at terminal 53 again increases which again results in a slowly increasing voltage 93 at the base of transistor 61. During the audio pause 74 the voltage 90 falls to a minimum level 94 related to the background noise which then exists during the pause. The voltage 90 remains substantially constant throughout the audio pause 74 while again slowly increasing (95) throughout the duration of the subsequent tone 75.

Components 56 through 60 therefore generally comprise a minimum level detection circuit for rapidly responding with a first time constant (determined by capacitor 60 and resistor 58) to a minimum magnitude of the signal present at terminal 53 and slowly responding with a second time constant (determined by capacitor 60 and resistor 59) to maximum magnitudes of the signal at terminal 53. Because of the large difference between these two time constants and the extremely slow rise time of the voltage 90 (the scale in FIG. 2C is greatly exagerated), the entire voltage waveform 90 will substantially represent the minimum noise floor level of the input signal at terminal 15. The slow rise of the voltage 90 during an audio tone is functionally used as a noise floor reset which allows the noise level indicative circuit 10 to sense slow increases in the minimum background noise level of the signal at terminal 15.

Transistor 61 merely represents an emitter follower which is used to create resistive isolation between the capacitor 60 and the noise floor indicative output terminal 63. The voltage at terminal 63 is therefore identical to the voltage at the base of the transistor 61 except that it is shifted downward by 0.7 volts.

In all of the above discussion the attenuator control signal present at terminal 26 was considered to have a constant value. However the attenuator control signal is created by the control circuit 14 and is a function of the noise floor level indicative signal present at the base of transistor 61 which is conducted to the control circuit 14 by conductor 64a. The transistor 64 is an emitter follower which, in conjunction with resistor 65, converts the noise floor indicative voltage 90 into a control current at terminal 26. A portion of this control current is used to flow through the attenuator diodes 22 and 24. The resistors 66, 23 and 25 help shade the final response characteristic of the attenuator 11 to this control current. By controlling the series DC current through diodes 22 and 24, the resistance of these diodes is varied in a nonlinear manner as a function of the control current present at terminal 26 and a nonlinear attenuator loop is created. The nonlinear diode resistance variation is caused by the basically nonlinear voltage (and resistance) versus current characteristics of a diode.

The nonlinear loop effectively ignores any audio tones and creates a varying attenuation, in response to the signal noise floor, which attempts to produce a signal at terminal 32 which has a constant noise floor level. Thus a nonlinear AGC loop has been created which effectively maintains a constant noise floor level at terminal 32, while the AGC control voltage present at the base of transistor 61 is used as a background noise floor level indicating signal.

The actual waveform present at terminal 32 when the control circuit 14 supplies an attenuator control signal to the terminal 26 is illustrated graphically in FIG. 2D as a voltage waveform 100. The waveform 100 corresponds to the response of the circuit 10 to the input signal 70. Here the noise floor amplitude during the audio pauses 72 and 74 is maintained at a substantially equal level, shown by the amplitudes 102 and 104, while a noise floor indicative signal at terminal 63 is produced. The absolute magnitude and percentage of change of the noise level indicative signal in response to an audio signal can be easily and precisely adjusted by varying the resistance values of several of the resistors in circuit 10.

FIG. 2D illustrates the fact that the inventive noise floor indicative circuit 10 essentially ignores the magnitude of any audio tones and sets the gain of the variable gain circuitry, consisting of the variable attenuator 11 and the amplifier 12, according to the background noise level of the input signal present at terminal 15. Control circuit 14 therefore represents a negative feedback control loop which reduces the signal gain in response to a large background noise input and increases the gain in response to a small background noise level. The control voltage of this negative feedback loop is also used as an input noise level indicative signal. The use of a nonlinear negative feedback loop to determine the background noise level of an input signal increases the dynamic noise range capabilities of the noise indicating circuit 10. The nonlinear attenuation versus control voltage characteristic is substantially caused by the nonlinear resistance versus control current characteristics of the diodes 22 and 24. The result is that the noise level indicative circuit 10 is able to accomodate extremely large variations in noise level inputs and produce a noise level indicative signal which is continuously variable over an extended range of noise inputs. Such a result is extremely useful in receiver voting systems in which many noise level indicative signals must be compared.

In one practical embodiment of the noise level indicative circuit 10, an input background noise variation from 0 to 40 db was able to produce a continuously and nonlinearly variable noise level indicative signal at terminal 63 which varied over a range of approximately 10 volts. The following component values were used in obtaining the above results.

| | |
|---|---|
| $C_{17}$ = .02 μf (microfarads) | $R_{46}$ = 1K ohms |
| $R_{18}$ = 56.2K (kilo)ohms | $R_{46}$ = 1K ohms |
| $R_{21}$ = 56.2K ohms | $R_{49}$ = 10K ohms |
| $R_{23}$ = 49K ohms | $R_{50}$ = 100 ohms |
| $R_{25}$ = 49K ohms | $R_{52}$ = 100 ohms |
| $C_{27}$ = 15 μf | $R_{54}$ = 100K ohms |
| $R_{33}$ = 56.2K ohms | $C_{55}$ = 15 μf |
| $R_{34}$ = 56.2K ohms | $R_{58}$ = 100 ohms |
| $R_{35}$ = 10K ohms | $R_{59}$ = 100K ohms |
| $R_{37}$ = 332K ohms | $C_{60}$ = 15 μf |
| $R_{38}$ = 15K ohms | $R_{62}$ = 47K ohms |
| $C_{41}$ = .2 μf | $R_{65}$ = 56.2K ohms |
| $R_{43}$ = 10K ohms | $R_{66}$ = 4.02K ohms |
| $R_{44}$ = 10K ohms | |

While I have shown and described a specific embodiment of this invention in relation to a noise floor indicative circuit, the present invention is not limited to such an application and can be used in any circuit application where a floor level indicating signal is desired. Also the present invention is not limied to the use of the nonlinear resistance versus current characteristic of a diode to obtain a nonlinear attenuation versus control signal characteristic. The use of any amplifier circuit which produces a nonlinear gain change in response to a control voltage is within the scope of the present invention.

While I have shown and described specific embodiments of this invention, further modifications and improvements will occur to those skilled in the art. All such modifications which retain the basic underlying principles disclosed and claimed herein are within the scope of this invention.

I claim:

1. An improved circuit for providing a floor indicative signal for input signals having floor levels varying over a large dynamic range, comprising:
   amplifier means having a controllable predetermined gain for receiving an input signal having a first floor level and producing an output signal having a second floor level, said second floor level being related to said first floor level by the gain of said amplifier means;
   detector means coupled to said amplifier means for receiving said output signal and producing a floor level indicative signal related to said second floor level, said detector means including a peak level detection means for receiving said output signal and producing a first signal corresponding to the peak magnitudes of said output signal, and said detector means including a minimum level detection means for receiving said first signal and producing a second signal having a magnitude substantially corresponding to the minimum magnitude of said first signal, said second signal determining the magnitude of said floor level indicative signal; and
   control means for inversely and nonlinearly varying the gain of said amplifier means directly in response to the magnitude of said second signal, said control means comprising a control feedback loop for said second signal coupled between said detector means and said amplifier means, whereby said feedback loop enables the circuit to produce corresponding floor level indicative signals for input signals with floor levels which vary over a large dynamic range.

2. An improved signal floor level indicative circuit according to claim 1 wherein said minimum level detection means comprises circuitry for producing said second signal by rapidly responding with a first time contant to a minimum magnitude of said first signal and slowly responding with a second time constant to a maximum magnitude of said first signal, said first time constant being substantially smaller than said second time constant.

3. An improved signal floor level indicative circuit according to claim 2 wherein said amplifier means comprises a series combination of a constant gain amplifier and a controllable attenuator.

4. An improved signal floor level indicative circuit according to claim 3 wherein said control means includes circuitry for producing a control signal that varies substantially as said floor indicative signal.

5. An improved signal floor level indicative circuit according to claim 4 wherein said attenuator includes at least one diode for controlling the attenuation of said attenuator, said diode having its resistance determined by said control signal.

6. An improved circuit for providing an accurate noise indicative signal for input signals having noise levels varying over a large dynamic range, said circuit comprising:
   amplifier means having a controllable predetermined gain for receiving an input signal with random peaks and pauses of signal activity and having a first noise floor level, said amplifier means producing an output signal having a second noise floor level related to said first noise floor level by the gain of said amplifier means;
   detector means coupled to said amplifier means for receiving said output signal and producing a noise floor level indicating signal related to said second noise floor level, said detector means including a peak level detection means for receiving said output signal and producing a first signal that substantially corresponds to the peak magnitudes of said output signal, and said detector means including a minimum level detection means for receiving said first signal and producing a second signal substantially corresponding to the minimum magnitude of said first signal, said second signal determining the magnitude of said floor level indicative signal; and
   control means for inversely and non-linearly varying the gain of said amplifier means directly in response to the magnitude of said second signal, said control means comprising a control feedback loop for said second signal coupled between said detector means and said amplifier means, whereby said feedback loop enables the circuit to produce corresponding floor level indicative signals for input signals with floor levels which vary over a large dynamic range.

7. An improved signal noise level indicative circuit according to claim 6 wherein said minimum level detection means comprises circuitry for producing said second signal by rapidly responding with a first time constant to a minimum magnitude of said first signal and slowly responding with a second time constant to a maximum magnitude of said first signal, said first time constant being substantially smaller than said second time constant.

8. An improved signal noise level indicative circuit according to claim 7 wherein said input and output signals are audio signals.

* * * * *